United States Patent
Minato

(10) Patent No.: US 10,424,693 B2
(45) Date of Patent: Sep. 24, 2019

(54) SEMICONDUCTOR LIGHT EMITTING ELEMENT HAVING FIRST SEMICONDUCTOR LAYER AND HOLES THROUGH SECOND SEMICONDUCTOR LAYER TO EXPOSE THE FIRST SEMICONDUCTOR LAYER

(71) Applicant: NICHIA CORPORATION, Anan-shi (JP)

(72) Inventor: Shunsuke Minato, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/892,298

(22) Filed: Feb. 8, 2018

(65) Prior Publication Data

US 2018/0166610 A1 Jun. 14, 2018

Related U.S. Application Data

(62) Division of application No. 15/273,713, filed on Sep. 23, 2016, now Pat. No. 9,923,120.

(30) Foreign Application Priority Data

Sep. 26, 2015 (JP) .................. 2015-189038

(51) Int. Cl.
*H01L 33/38* (2010.01)
*H01L 33/00* (2010.01)
(Continued)

(52) U.S. Cl.
CPC ........ *H01L 33/382* (2013.01); *H01L 33/0075* (2013.01); *H01L 33/32* (2013.01);
(Continued)

(58) Field of Classification Search
CPC ........... H01L 33/382; H01L 2933/0016; H01L 33/405; H01L 33/38–387
See application file for complete search history.

(56) References Cited

U.S. PATENT DOCUMENTS 8,669,582 B2 * 3/2014 Na .......................... H01L 33/14
257/99
8,716,732 B2 * 5/2014 Kamiya ................ H01L 33/382
257/15
(Continued)

FOREIGN PATENT DOCUMENTS

JP 07-122518 5/1995
JP 09-022882 1/1997
(Continued)

OTHER PUBLICATIONS

Office Action with Form PTO-892 Notice of References Cited issued by the U.S. Patent and Trademark Office for the parent U.S. Appl. No. 15/273,713, dated May 18, 2017.
(Continued)

*Primary Examiner* — Stephen M Bradley
(74) *Attorney, Agent, or Firm* — Mori & Ward, LLP

(57) ABSTRACT

A semiconductor light emitting element includes a first semiconductor layer, an active layer, a second semiconductor layer, a first conducting layer, a second conducting layer, and an insulating layer. The insulating layer is disposed at least on or above the upper surface of the second conducting layer. Holes are opened at given intervals through the second semiconductor layer to expose the first semiconductor layer at bottom surfaces of the holes. In each of the holes, the insulating layer covers from a side-wall surface of each of the holes to a first region provided on or above the upper surface of the second conducting layer around a top of each of the holes. The first conducting layer covers from the bottom surface of each of the holes to a second region
(Continued)

provided over the second conducting layer and the insulating layer around the top of each of the holes.

14 Claims, 11 Drawing Sheets

(51) Int. Cl.
*H01L 33/32* (2010.01)
*H01L 33/44* (2010.01)

(52) U.S. Cl.
CPC ...... *H01L 33/44* (2013.01); *H01L 2933/0016* (2013.01); *H01L 2933/0025* (2013.01)

(56) References Cited

U.S. PATENT DOCUMENTS

| | | | |
|---|---|---|---|
| 9,006,775 B1* | 4/2015 | Kuo | H01L 33/382 |
| | | | 257/100 |
| 9,059,339 B1 | 6/2015 | Bayram et al. | |
| 9,419,182 B2* | 8/2016 | Schubert | H01L 33/0079 |
| 2008/0031295 A1 | 2/2008 | Tanaka | |
| 2010/0102342 A1 | 4/2010 | Matsui et al. | |
| 2010/0270573 A1 | 10/2010 | Hwang | |
| 2013/0161585 A1 | 6/2013 | Na et al. | |
| 2013/0277696 A1 | 10/2013 | Matsui et al. | |
| 2013/0292719 A1 | 11/2013 | Lee et al. | |
| 2014/0034992 A1 | 2/2014 | Ichihara et al. | |
| 2015/0270446 A1 | 9/2015 | Neumann | |
| 2016/0005941 A1* | 1/2016 | Tsai | H01L 33/382 |
| | | | 257/98 |
| 2016/0104814 A1 | 4/2016 | Hwang et al. | |
| 2016/0149085 A1* | 5/2016 | Kashimoto | H01L 33/385 |
| | | | 438/47 |

FOREIGN PATENT DOCUMENTS

| | | |
|---|---|---|
| JP | 2005-322722 | 11/2005 |
| JP | 2009-026866 | 2/2009 |
| JP | 2010-003906 | 1/2010 |
| JP | 2011-517100 | 5/2011 |
| JP | 2012-138499 | 7/2012 |
| JP | 2013-135234 | 7/2013 |
| JP | 2013-538459 | 10/2013 |
| JP | 2014-067894 | 4/2014 |
| WO | WO 2009/158175 | 12/2009 |
| WO | WO 2012/047342 | 4/2012 |
| WO | WO 2012/141031 | 10/2012 |

OTHER PUBLICATIONS

Notice of Allowance with Form PTO-892 Notice of References Cited issued by the United States Patent and Trademark Office for the parent U.S. Appl. No. 15/273,713, dated Nov. 13, 2017.

* cited by examiner

SEMICONDUCTOR LIGHT EMITTING ELEMENT HAVING FIRST SEMICONDUCTOR LAYER AND HOLES THROUGH SECOND SEMICONDUCTOR LAYER TO EXPOSE THE FIRST SEMICONDUCTOR LAYER

CROSS-REFERENCE TO RELATED APPLICATIONS

The present application is a divisional application of the U.S. patent application Ser. No. 15/273,713 filed Sep. 23, 2016, which claims priority under 35 U.S.C. 119 to Japanese Patent Application No. 2015-189038, filed Sep. 26, 2015. The contents of these applications are incorporated herein by reference in its entirety.

BACKGROUND

1. Technical Field

The disclosure described below relates to a semiconductor light emitting element.

2. Description of the Related-Art

Semiconductor light emitting elements such as light emitting diodes (LEDs) and laser diodes (LDs) are used extensively in a variety of light source applications, e.g. in back-light applications, in illumination and lighting applications, in traffic signals, and in large-screen displays. In recent years, demand has developed for higher light output from these types of light emitting elements, and corresponding to that demand, structures that increase the area of light emitting regions formed on a single, monolithic substrate have evolved. As one example of these types of semiconductor light emitting elements, an LED is shown in plan view and in cross-sectional view in FIGS. 10 and 11 respectively. The LED 90 in these figures has a semiconductor stack that includes an n-type semiconductor layer 91, an active layer 93, and a p-type semiconductor layer 92 grown on a substrate. The semiconductor stack is locally etched to form holes 95 that expose n-type semiconductor layer 91 at the bottom surfaces of the etch-holes 95. In addition, p-side electrodes 99 and n-side electrodes 98 are formed contacting the p-type semiconductor layer 92 and n-type semiconductor layer 91 respectively (See Japanese Laid-Open Patent Publications Nos. H07-122518A (1995), H09-022882A (1997), 2009-026866A, 2005-322722A, 2012-138499A, 2013-135234A, and 2011-517100A)

SUMMARY

According to one aspect of the present invention, a semiconductor light emitting element includes a first semiconductor layer, an active layer, a second semiconductor layer, a first conducting layer, a second conducting layer, and an insulating layer. The first semiconductor layer has a first conducting type. The active layer is disposed over the first semiconductor layer. The second semiconductor layer is disposed over the active layer and has a second conducting type different than the first conducting type. The first conducting layer is electrically connected to the first semiconductor layer. The first conducting layer is a light-transmitting conducting layer. The second conducting layer is disposed on an upper surface of the second semiconductor layer. The second conducting layer is a light-transmitting conducting layer. The insulating layer is disposed at least on or above the upper surface of the second conducting layer. A plurality of holes are opened at given intervals through the second semiconductor layer to expose the first semiconductor layer at bottom surfaces of the holes. In each of the holes, the insulating layer covers from a side-wall surface of each of the holes to a first region provided on or above the upper surface of the second conducting layer around a top of each of the holes. The first conducting layer covers from the bottom surface of each of the holes to a second region provided over the second conducting layer and the insulating layer around the top of each of the holes.

BRIEF DESCRIPTION OF THE DRAWINGS

A more complete appreciation of the invention and many of its attendant advantages thereof will be readily obtained as the same becomes better understood by reference to the following detailed description when considered in connection with the following accompanying drawings.

DESCRIPTION OF THE EMBODIMENTS

Figure 1:
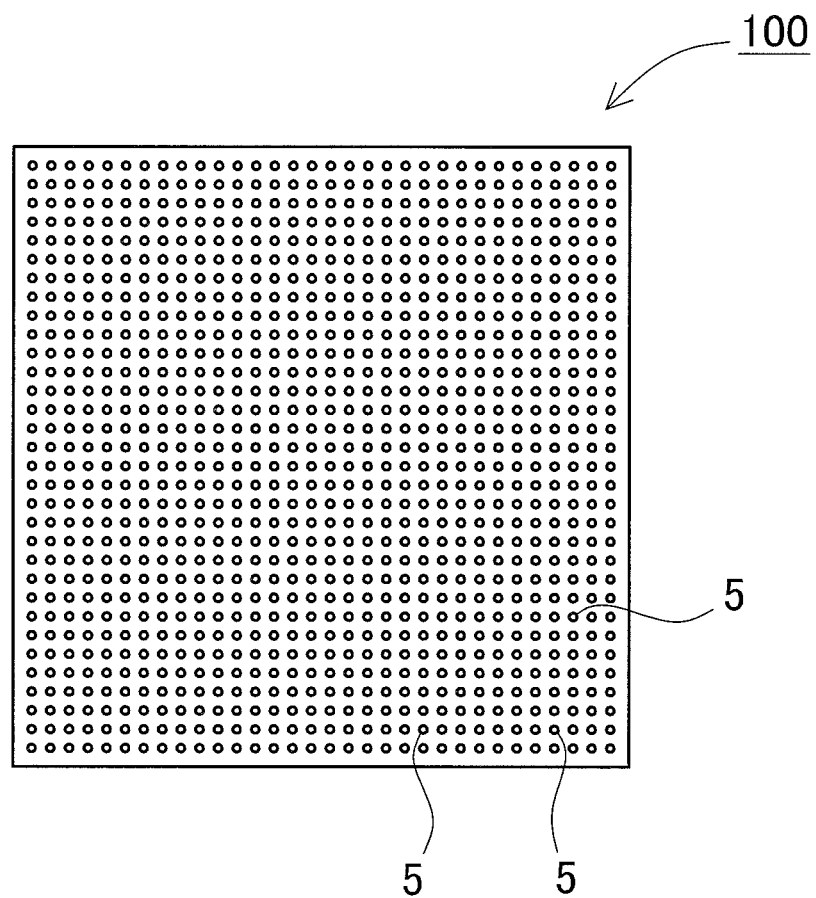
FIG. 1 is a plan view showing a semiconductor light emitting element according to one embodiment of the present invention.

The embodiments will now be described with reference to the accompanying drawings, wherein like reference numerals designate corresponding or identical elements throughout the various drawings.

The following describes embodiments and examples of the present invention with reference to the accompanying drawings. Here, similar reference numbers designate corresponding or identical components in the drawings. However, the following embodiments and examples are simply examples presented to concretely illustrate technical concepts associated with the present invention, and the present invention is not limited to the embodiments described below. In addition, components cited in the claims of this application are in no way limited to the components described in the embodiments. Particularly, in the absence of specific annotation, structural component features described below such as dimensions, raw material, shape, and relative position are simply for the purpose of explicative example and are not intended to limit the scope of the invention. Properties such as the size and spatial relation of components shown in the figures may be exaggerated for the purpose of clear explanation. In the descriptions below, components with the same name and label number indicate identical or materially the same components and their detailed description may be appropriately abbreviated. Further, a single component can serve multiple functions and a plurality of structural elements of the invention can be implemented with the same component. In contrast, the functions of a single component can be separated and implemented by a plurality of components.

First Embodiment

Figure 2:
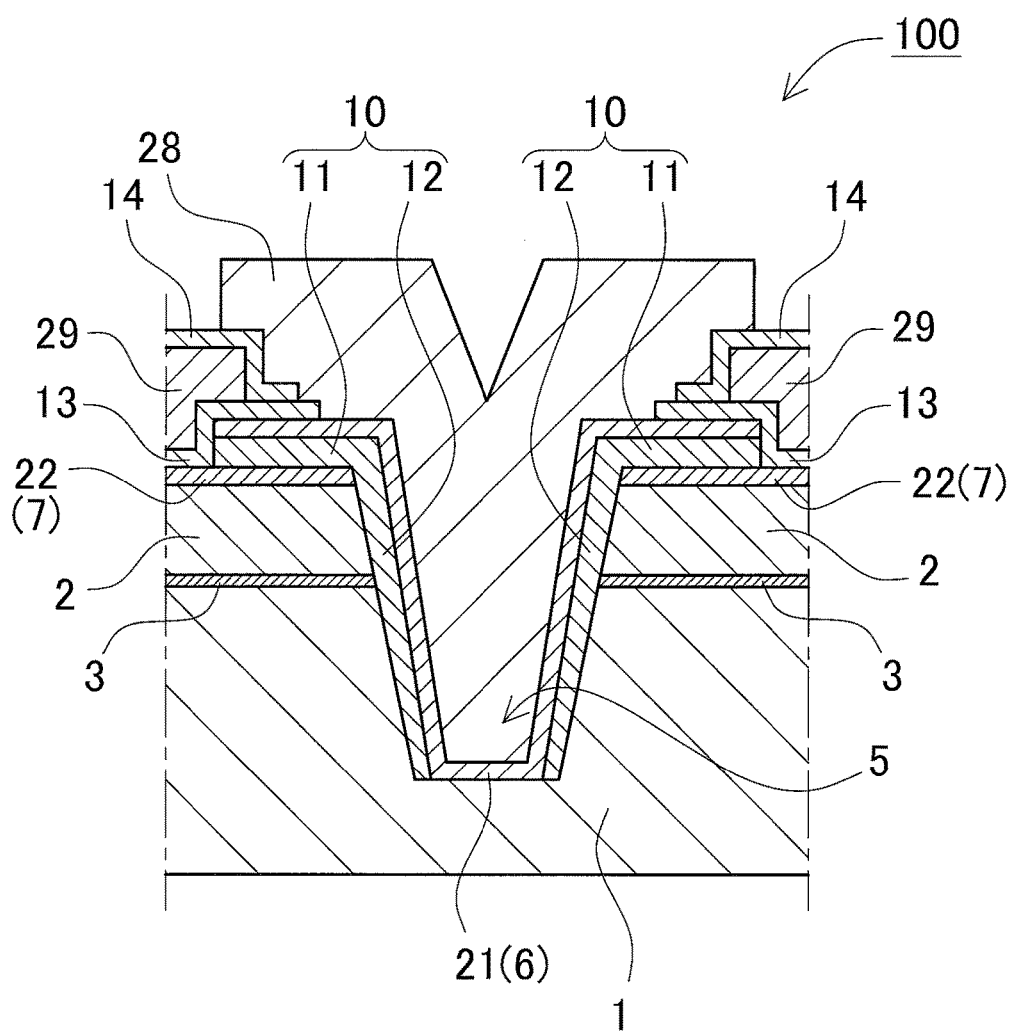
FIG. 2 is an enlarged cross-sectional view showing principal elements of a hole formed in the semiconductor light emitting element of FIG. 1.

A semiconductor light emitting element 100 according to the first embodiment of the present invention is shown in a plan view and in enlarged cross-sectional view in FIGS. 1 and 2 respectively. The semiconductor light emitting element 100 in these figures is made up of a semiconductor stack, a first electrode 6, and a second electrode 7. The semiconductor stack is made up of a first semiconductor layer 1, an active layer 3 formed over the first semiconductor layer 1, a second semiconductor layer 2 formed over the active layer 3 and having a conducting type different than that of the first semiconductor layer 1, and an insulating layer 10 formed over the second semiconductor layer 2.

Typically, the first semiconductor layer 1 is an n-type semiconductor, and the second semiconductor layer is a p-type semiconductor. Nitride semiconductor such as $In_xAl_yGa_{1-x-y}N$, ($0 \leq x$, $0 \leq y$, $x+y<1$) can be used as a first conducting type first semiconductor layer, the active layer 3, and a second conducting type second semiconductor layer. For example, the first semiconductor layer can be an n-type nitride semiconductor, and the second semiconductor layer can be a p-type nitride semiconductor.

The first electrode 6 and the second electrode 7 can be formed from metals such as Au, Pt, Pd, Rh, Ni, W, Mo, Cr, Ti, Al, and Cu or alloys that include at least one of those metals. The first electrode 6 and the second electrode 7 can be formed as single layers or as multi-layer metal-film stacks such as Ti/Rh/Au, Ti/Pt/Au, W/Pt/Au, Rh/Pt/Au, Ni/Pt/Au, Al—Cu alloy/Ti/Pt/Au, Al—Si—Cu alloy/Ti/Pt/Au, Ti/Rh, and Ti/Rh/Ti/Pt/Au. Further, the first electrode 6 and the second electrode 7 can also include light-transmitting conducting layers (discussed later). Film thickness can be any of the values used in the industry.

The first electrode 6 electrically connects to the first semiconductor layer 1 and at least includes a first conducting layer 21. The second electrode 7 electrically connects to the second semiconductor layer 2. The second electrode 7 includes a second conducting layer 22 formed on the upper surface of the second semiconductor layer 2. Preferably, the first conducting layer 21 and the second conducting layer 22 are light-transmitting conducting layers. This allows first and second conducting layer 21, 22 light-absorption to be reduced. Here, it is desirable to dispose a light-reflecting layer above the first conducting layer 21 and the second conducting layer 22 (on an electrode-side rather than on a semiconductor-side) to reflect light that passes through the first and second conducting layers 21, 22 back into the semiconductor stack. For example, a third insulating layer 13 can be configured as a multi-layer dielectric stack that is light-reflecting.

(Holes 5)

A plurality of holes 5 are established at given intervals in the semiconductor stack. The holes 5 are opened from the upper side of the second semiconductor layer 2 to expose the first semiconductor layer 1 through the active layer 3 and the second semiconductor layer 2. Further, the insulating layer 10 covers regions from a side-wall of each of the holes 5 to above the second semiconductor layer 2 around the top of each of the holes 5. In this manner, the insulating layer 10 is disposed over the upper surface of the second conducting layer 22 around the top of each of the holes 5. $SiO_2$ film can be used as the insulating layer 10.

Compared to methods that use a mask to delineate an insulating layer in related arts, adoption of this structure can reduce the area occupied by the insulating layer in regions that expose the first semiconductor layer. Since this increases the light emitting area, high output light emitting elements are made practicable.

Figure 11:
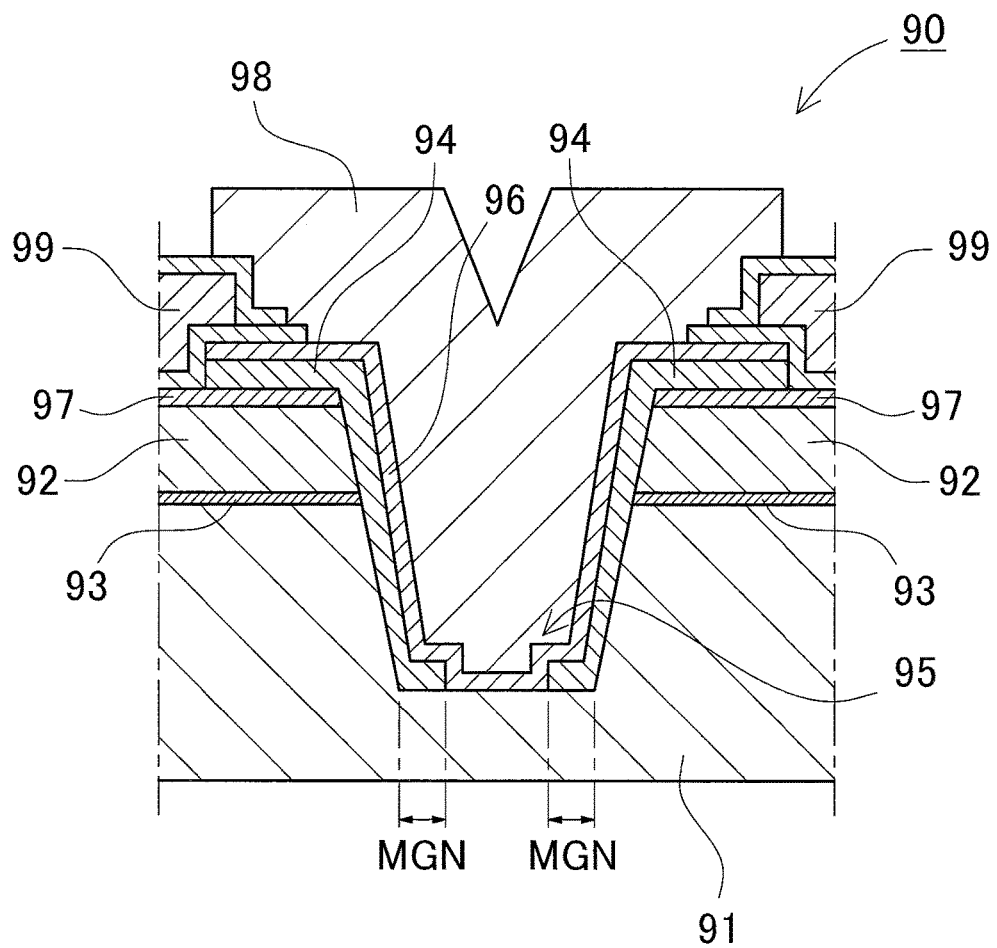
FIG. 11 is an enlarged cross-sectional view of the LED in FIG. 10.
Figure 12:
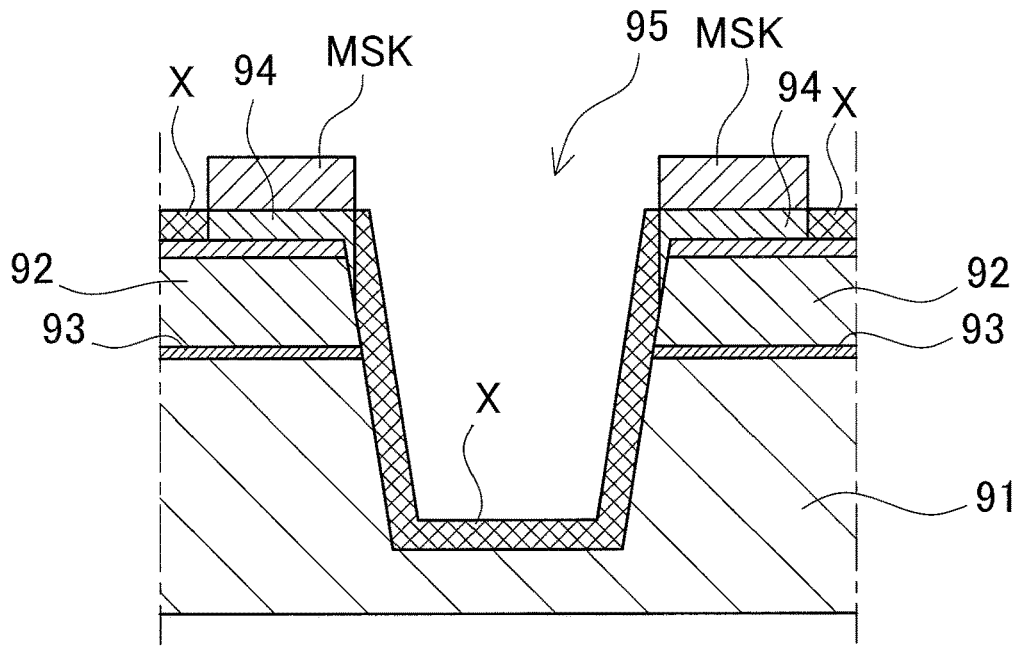
FIG. 12 is a cross-sectional view showing a related-art LED.
Figure 13:
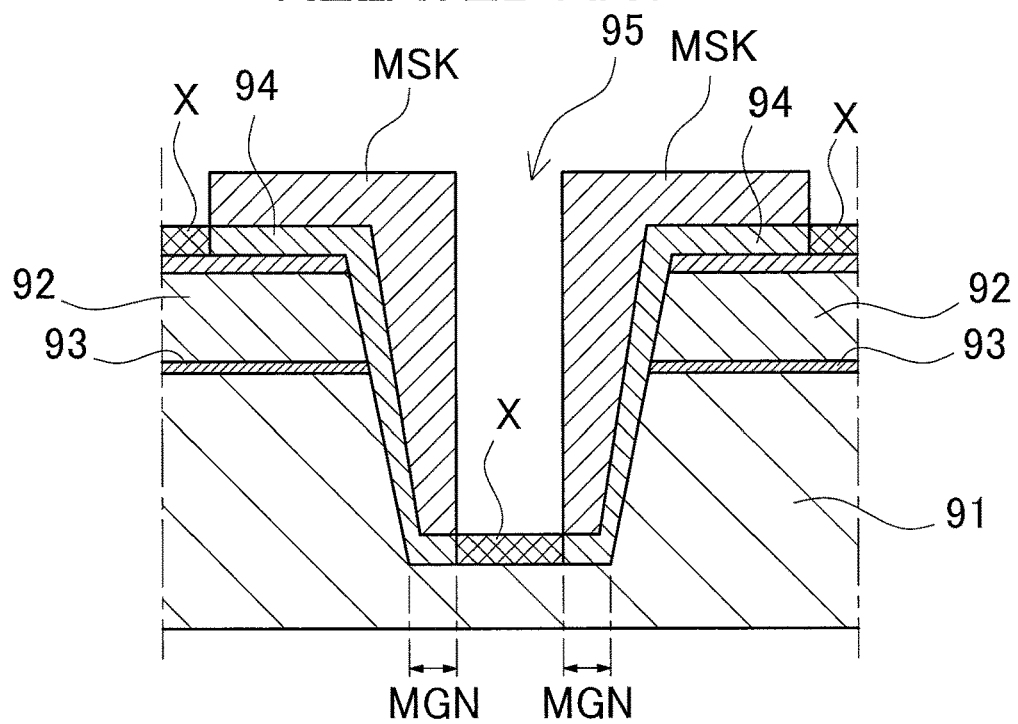
FIG. 13 is a cross-sectional view showing a related-art LED.

When forming holes and insulating the regions between electrodes, the structure shown in the cross-sectional view of FIG. 11 has been adopted in related arts. In this structure, insulating film margin MGN is established. Specifically, to form the insulating film 94 in the desired pattern, processing initially forms the insulating film 94 globally over the all surfaces, protects essential regions with a mask MSK, and etches non-essential regions of the insulating film 94 as shown in the cross-sectional view of FIG. 12. If the mask MSK is positioned exactly coincident with side-walls of the holes in the semiconductor stack, insulating film 94 regions labeled X in FIG. 12 are removed in the etching step. This can result in exposure of the hole side-walls, and makes it likely that p-type semiconductor layer 92 and active layer 93 are exposed rather than being covered by insulating film 94. To avoid this condition, the mask MSK normally includes margin MGN that extends mask edges to reliably cover the side-walls, as shown in the cross-sectional view of FIG. 13. As a result, the bottom surface of each hole 95, which is an etch cavity locally exposing n-type semiconductor layer 91, includes an overlap region around the perimeter that is covered by the insulating film 94. Further, since this insulating film margin MGN is required around the bottom surface of each hole 95, two margin MGN regions exist between the light emitting semiconductor structures disposed on opposite sides of each of the holes 5 as viewed in cross-sectional view. Accordingly, limited substrate area is significantly consumed by regions that do not contribute to light emission and light emitting efficiency is reduced. Further, as the amount of the insulating film 94 margin MGN in each of the holes 5 increases, the distance between regions where the p-type conducting layer 97 contacts the p-type semiconductor layer 92 and regions where the n-type conducting layer 96 contacts the n-type semiconductor layer 91 increases. This increases the lateral resistance component in the semiconductor layers, leads to higher forward-bias voltage Vf, and invites issues including increased heat generation and reduced applied power efficiency.

In contrast, as shown in the cross-sectional view of FIG. 2, a semiconductor light emitting element 100 structure that excludes the insulating layer 10 margin can eliminate wasted area that does not contribute to light emission. In particular, by essentially eliminating insulating layer 10 around the periphery of the bottom surface of each of the holes 5, which is a cavity formed by local etching to expose the n-type semiconductor layer (one example of the first semiconductor layer 1), contact area can be increased between the n-type conducting layer (one example of first conducting layer 21) and the n-type semiconductor layer. As a result, the area of exposed regions of the n-type semiconductor layer can be reduced by an amount equivalent to the eliminated margin. Specifically, for the case where contact area between the n-type conducting layer and the n-type semiconductor layer is the same in FIG. 2 and FIG. 11, the area of regions (cavities) that expose the n-type semiconductor layer is reduced for the embodiment shown in FIG. 2 compared to the related-art shown in FIG. 11. Since reduction in the area of the exposed regions of the n-type semiconductor layer means the area of other regions can be increased, active layer 3 area, which is the light emitting area, can be increased resulting in increased light output.

This structure has the positive feature that efficient etch-hole lay-out can reduce wasted area equivalent to the unnecessary margin. The number, size, and lay-out pattern of the holes are determined by the required unit size of the semiconductor light emitting element and element specifications that include electrical characteristics. For example, it is desirable for the holes 5 to have a circular shape as viewed from above. If the hole 5 shape viewed from above is square or other shape that includes angles, current can concentrate in the angular regions. In contrast, circular holes 5 can distribute the current uniformly. Lay-out of a plurality of holes 5 can be in a matrix pattern when the element is viewed from above. For example, the number of holes 5 can be fifty or more. As the number of holes 5 is increased, the contact area between first conducting layer 21 and first semiconductor layer 1 increases. Further, by disposing numerous holes 5 in a matrix pattern, first conducting layer 21-to-first semiconductor layer 1 contact regions can be distributed over the entire area of the semiconductor light emitting element. This allows forward-bias voltage (Vf) reduction and enables more uniform light intensity distribution over the area of the element.

The distance between adjacent holes 5 (pitch minus hole diameter) can be, for example, less than or equal to 40 µm. Further, the inside diameter of each of the holes 5 is preferably less than or equal to 10 µm. In the example shown in FIG. 1, 1024 holes 5, each having a 7 µm diameter φ, are established in a 1 mm square semiconductor light emitting element with a 30 µm pitch in a 32 row by 32 columns (32×32)=1024 lay-out.

Figure 3:
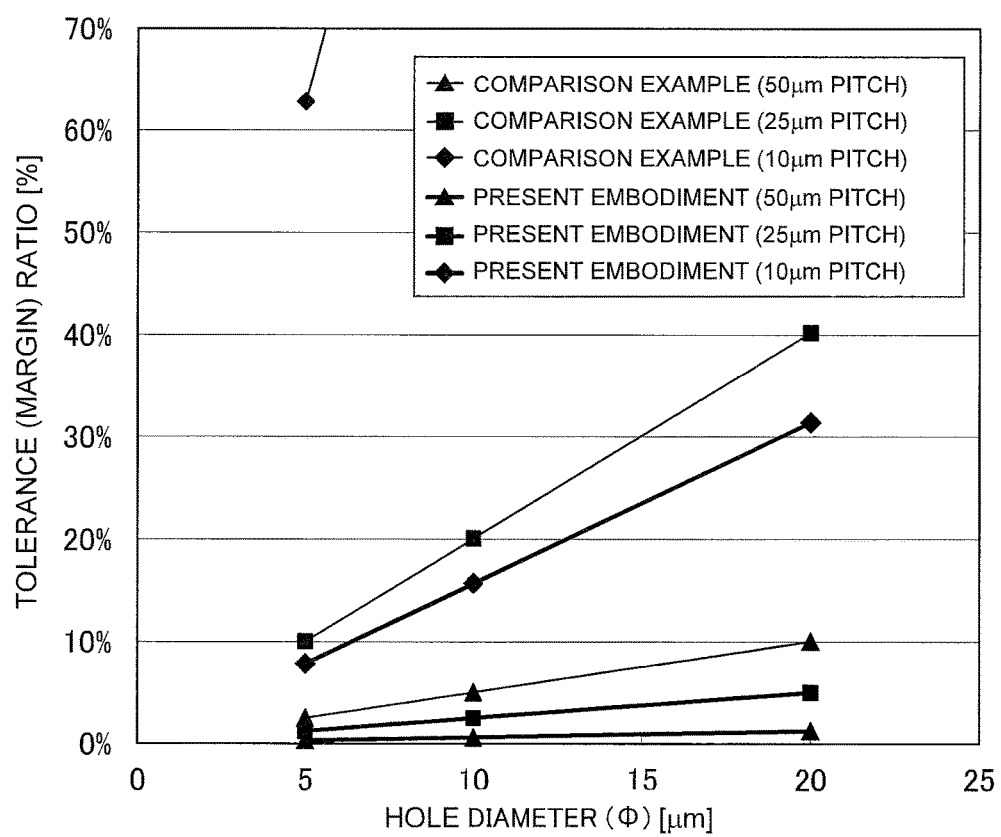
FIG. 3 is a graph showing the relation between hole inside diameter and the ratio of margin to total element area.

Turning to FIG. 3, the ratio of the insulating layer margin to the element area is shown. In this figure, the required margin ratio is calculated and plotted for the present embodiment and for a comparison example (i.e. the related-art structure shown in FIG. 11) with holes uniformly distributed over a 1 mm square element area with a pitch of 10 µm, 25 µm, and 50 µm. In the graph of FIG. 3, the horizontal axis is the inside diameter φ of the holes and the vertical axis is the required insulating layer margin ratio. The margin ratio is the ratio of the summed area of all the margin regions to the total semiconductor light emitting element area as viewed in a plan view. The margin ratio is proportional to the hole diameter φ and inversely proportional to the hole pitch. For example, in FIG. 3, with a hole diameter φ of 10 µm and pitch of 25 µm, this embodiment has a margin of 3% compared to 20% for the related-art structure. With this graph, large reduction in non-light emitting margin area can be verified for the present embodiment. Note that pitch indicates the distance between center-points of adjacent holes. Specifically, if the hole diameter φ is 10 µm, a 50 µm pitch means there is a 40 µm interval between adjacent holes, a 25 µm pitch means there is a 15 µm interval between adjacent holes, and a 10 µm pitch means there is no interval between adjacent holes. In other words, pitch indicates the hole density. The smaller the pitch, the higher the hole density. In the case of high hole density with a pitch of 10 µm, the embodiment has a margin ratio from slightly less than 10% to slightly more than 30% while the comparison example has a minimum margin ratio exceeding 60%. When comparison example hole density becomes high, the margin ratio becomes extremely high, namely, there is extreme reduction in the light emitting area. In contrast, this embodiment can sufficiently suppress reduction in the light emitting area making semiconductor light emitting elements with high hole density possible. Note the graph of FIG. 3 shows the margin ratio for the comparison example only at a 5 µm hole diameter φ when the pitch is 10 µm, and the margin ratio for diameters φ of 10 µm or more are off the graph.

The film thickness of insulating layer 10 established on the side-walls of a hole 5 is made thinner near the bottom surface of the hole 5 than near the top of the hole 5. Compared to a structure having uniform thickness of the insulating layer 10 from the top of the hole to the bottom surface, this thickness gradient allows the area of the first conducting layer 21 in the exposed semiconductor region to be increased. Further, the first conducting layer 21 can cover and continuously extend from the bottom surface of the hole 5 to the region over the insulating layer 10 around the top of the hole 5.

The film thickness of insulating layer 10 at the top of a hole 5 is preferably made greater than or equal to 0.5 times, and less than or equal to 1.5 times the film thickness of the insulating layer 10 over the second semiconductor layer 2. This configuration enables the insulating layer 10 to maintain insulating properties at the top of the hole 5 that are similar to the properties over the second semiconductor layer 2.

(Method of Producing a Semiconductor Light Emitting Element)

Figure 4:
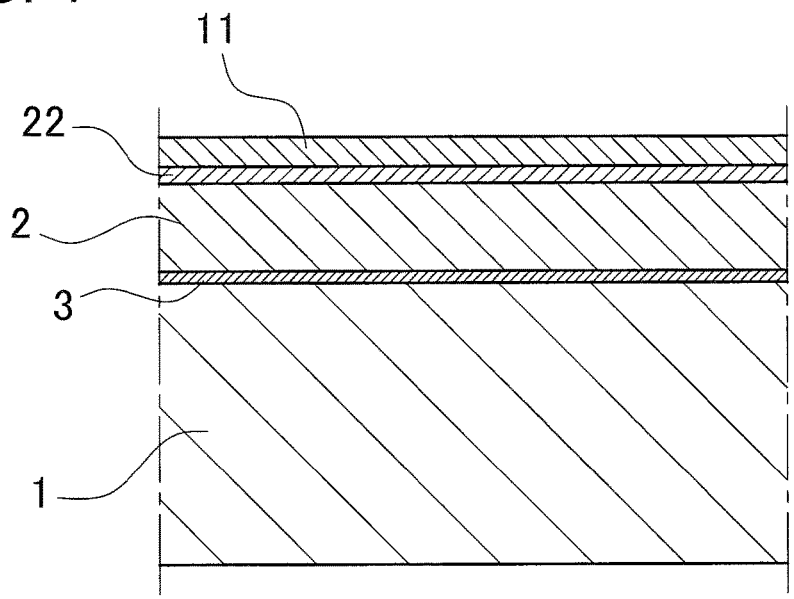
FIG. 4 is a schematic cross-sectional view showing a production of a semiconductor light emitting element according to the embodiment of the present invention.

The following describes a method of producing the semiconductor light emitting element 100 based on FIGS. 4-8. First, as shown in FIG. 4, a semiconductor stack is provided with a first semiconductor layer 1 (a n-type semiconductor layer), an active layer 3, a second semiconductor layer 2 (a p-type semiconductor layer), and a first insulating layer 11 stacked in that order. Normally, this type of semiconductor stack is formed on a substrate intended for semiconductor growth. An insulating substrate such as sapphire ($Al_2O_3$) or spinel ($MgAl_2O_4$) can be used as the substrate.

Figure 5:
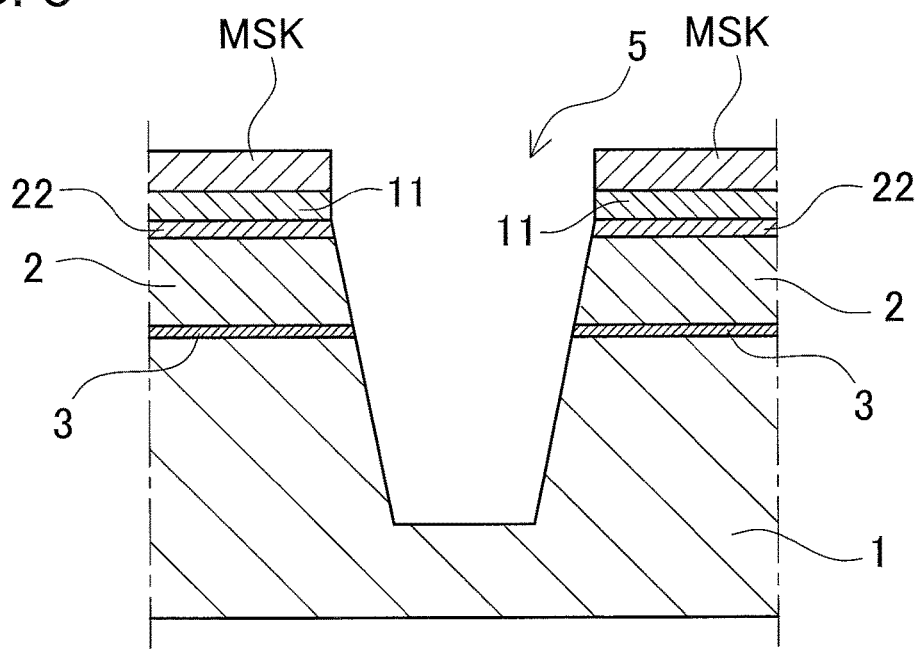
FIG. 5 is a schematic cross-sectional view showing a production of a semiconductor light emitting element according to the embodiment of the present invention.

Next, the first insulating layer 11 is covered by a mask MSK over non-etch region where the first semiconductor layer 1 is not to be exposed, and etching is performed to expose the first semiconductor layer 1 in the unmasked regions. As a result, as shown in FIG. 5, exposed regions of the n-type semiconductor layer are formed that locally expose the n-type semiconductor layer, which is the first semiconductor layer 1. Here, as shown in FIG. 5, each of the holes 5 preferably has a shape that widens from the bottom surface towards the upper end of the hole 5. This allows the insulating layer to be made with a tapered shape as described later. Further, it is desirable to form the exposed regions with second conducting layer 22 established effectively over the entire area of the second semiconductor layer 2. As shown in FIG. 5, this allows edges of the second conducting layer 22 to align with edges of the second semiconductor layer 2, and allows the distance from the region where second conducting layer 22 contacts second semiconductor layer 2 to the bottom surface of each of the holes 5 to be minimized. Specifically, this allows the distance between the region where the second conducting layer 22 contacts the second semiconductor layer 2 to the region where the first conducting layer 21 formed later contacts the first semiconductor layer 1 to be minimized. If the second conducting layer 22 is established with separation from upper edge of each of the holes 5, the separated regions become non-light emitting area. By eliminating those separated regions, light emitting area can be increased. In particular, when numerous holes 5 are established as shown in FIG. 1, the total separated region area becomes significant even for small separation around each of the holes 5. Therefore, it is desirable to eliminate separation of the second conducting layer 22 from the upper edge of each of the holes 5.

(Mask MSK)

A mask MSK having a plurality of local openings distributed in a matrix lay-out can be used as masking for the etching step that locally exposes the first semiconductor layer 1. Since this can distribute the regions where the first conducting layer 21 contacts the first semiconductor layer 1 over the entire semiconductor light emitting element area, forward-bias voltage (Vf) can be reduced and emission intensity can be made uniform over the entire area of the element.

Openings in the mask MSK set the size and location of the holes 5. Accordingly, the mask openings are formed corresponding to the desired disposition of holes 5 in the fully processed semiconductor light emitting element. For example, it is desirable for the mask openings to have a circular shape as viewed from above. It is also desirable for the diameter φ of the openings to be less than or equal to 10 µm, and for the distance between openings to be less than or equal to 40 µm. In addition, it is preferable to form 50 or more openings in the mask MSK.

(Second Insulating Layer 12)

Figure 6:
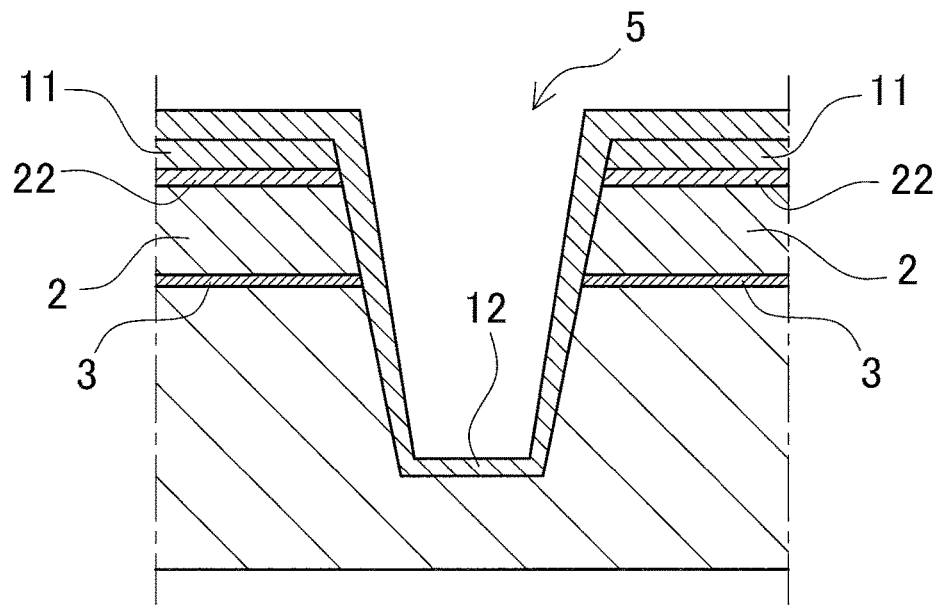
FIG. 6 is a schematic cross-sectional view showing a production of a semiconductor light emitting element according to the embodiment of the present invention.

After hole 5 etching, the mask MSK is removed and, as shown in FIG. 6, a second insulating layer 12 is formed to cover, in a continuous manner, upper surfaces of the first insulating layer 11 and the exposed regions of the first semiconductor layer 1 including side-wall of the hole 5.

Figure 7:
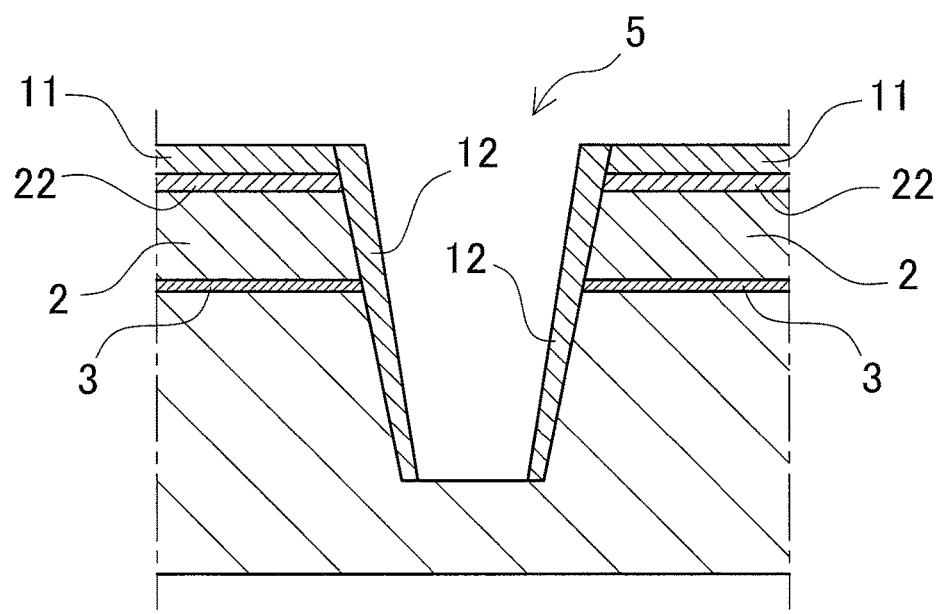
FIG. 7 is a schematic cross-sectional view showing a production of a semiconductor light emitting element according to the embodiment of the present invention.
Figure 8:
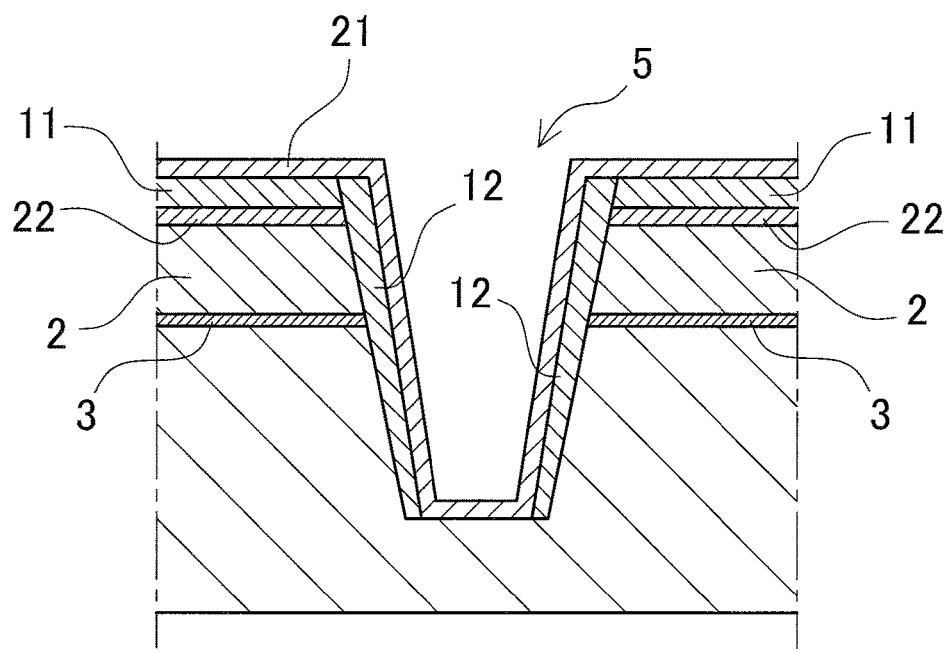
FIG. 8 is a schematic cross-sectional view showing a production of a semiconductor light emitting element according to the embodiment of the present invention.

Subsequently, etching is performed without masking. Specifically, as shown in FIG. 7, at least the second insulating layer 12 covering previously exposed regions of the first semiconductor layer 1 is etched to re-expose the first semiconductor layer 1 at the bottom surfaces of the holes 5. This second etching step is performed, for example, by dry etching. By performing anisotropic etching directed from above, the second insulating layer 12 that covers the hole 5 side-walls is difficult to remove and is retained even when etching proceeds to expose the first semiconductor layer 1 at the bottom surfaces of the holes 5. Next, as shown in FIG. 8, the first conducting layer 21 is formed to cover, in a continuous manner, from the exposed regions of the first semiconductor layer 1 to regions over the first insulating layer 11 including hole 5 side-walls.

Accordingly, since regions between the first semiconductor layer 1 and the second semiconductor layer 2 can be effectively insulated by the second insulating layer 12, there is no need to establish margin in the insulating layer between the semiconductor layers as in related arts. Namely, compared to methods that use mask delineation to establish the insulating layer between semiconductor layers in related arts, the present embodiment can reduce the first semiconductor layer 1 exposed region area that is occupied by the insulating layer 10. Since this increases the light emitting area, production of high output light emitting elements becomes practical. As shown in figures such as FIG. 7, it is desirable for the holes 5 have a shape that is wider at the top than at the bottom surface, and during the second etching step, this shape enables the second insulating layer 12 covering the hole 5 side-walls to be more readily etched away near the bottom surface of each of the holes 5 than near the top. Accordingly, film thickness of insulating layer 10 established on hole 5 side-walls can be made thinner at the bottom surface than at the upper edge of each of the holes 5. This insulating film thickness gradient makes it possible to increase the area of the first conducting layer 21 in the exposed semiconductor regions compared to the case where the insulating film thickness is uniform from the top to the bottom surface of each of the holes 5.

Figure 14A:
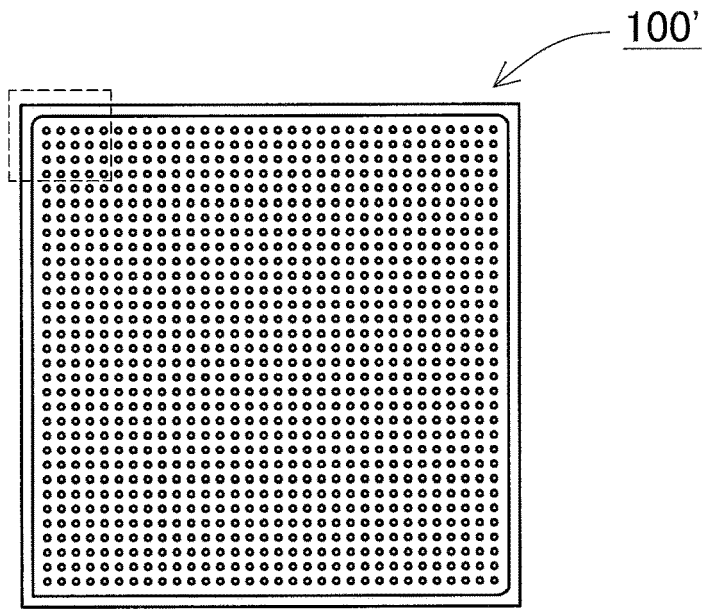
FIG. 14A is a plan view showing a semiconductor light emitting element according to another embodiment of the present invention.
Figure 14B:
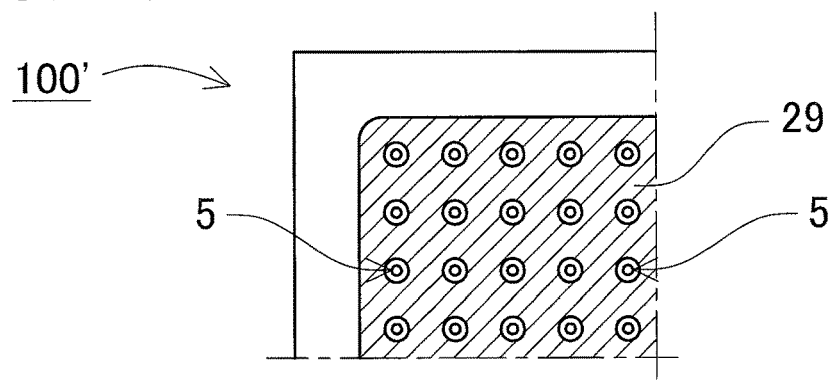
FIG. 14B is an enlarged cross-sectional view in the horizontal direction showing the second metal layer inside the broken-line box region of FIG. 14A.
Figure 14C:
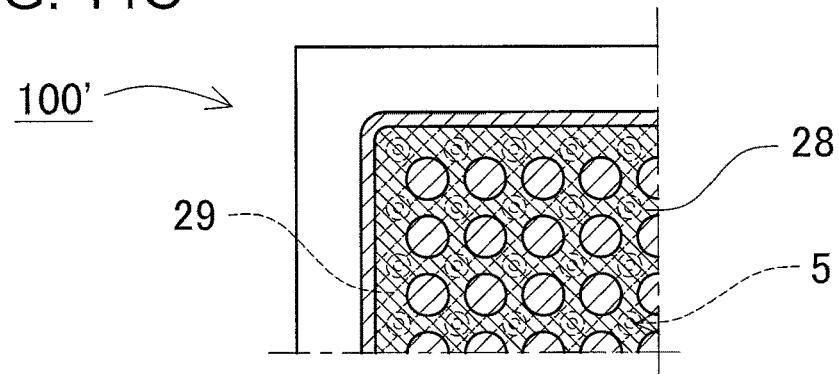
FIG. 14C is an enlarged cross-sectional view in the horizontal direction showing the first metal layer inside the broken-line box region of FIG. 14A.

After the forming step of the first conducting layer 21, additional processing can form a first metal layer 28 on the first conducting layer 21 and a second metal layer 29 on the second conducting layer 22. For example, for the alternate example semiconductor light emitting element 100' shown in the plan view of FIG. 14A, FIGS. 14B and 14C show enlarged horizontal cross-sectional views inside the broken-line box region of FIG. 14A. The cross-hatched area in FIG. 14B shows the second metal layer 29 established in contact with the second conducting layer 22. FIG. 14C shows the first metal layer 28, which is formed above the cross-sectional view of FIG. 14B and is established in contact with the first conducting layer 21. These first and second metal layers 28, 29 can serve as electrode pads for electrical connection of the element. The bottom layer of the electrode pads can be a metal such as Rh or Pt that can readily adhere to the conducting layer and can make Ohmic contact with the semiconductor via the conducting layer, which can be a light-transmitting oxidized material such as indium-tin-oxide (ITO). A bonding layer such as Au can be formed on top of the electrode pads. Here, insulating layers are formed to prevent short circuit between the first electrode 6 and the second electrode 7 by isolating the first conducting layer 21 and the first metal layer 28 from the second conducting layer 22 and the second metal layer 29. For example, as shown in FIG. 2, a third insulating layer 13 is disposed between the first conducting layer 21 and the second metal layer 29, and a fourth insulating layer 14 is disposed between the second metal layer 29 and the first metal layer 28.

(First Insulating Layer 11, Second Insulating Layer 12)

The first insulating layer 11 and second insulating layer 12 are preferably made of the same material. This allows the insulating properties of insulating layer material remaining after the second etching step to be the same on the hole side-walls as on the upper surfaces around the holes. Further, by establishing the first insulating layer 11 and the second insulating layer 12 as components of a single insulating structure, gaps or vacancies can be avoided and insulating properties improved. $SiO_2$ can be applied with good results for this type of insulating layer 10.

The film thickness of the second insulating layer 12 formed on top of the first insulating layer 11 can be made greater than or equal to 0.5 times, and less than or equal to 1.5 times the film thickness of the first insulating layer 11. This gives the second insulating layer 12 remaining after two etching steps a film thickness that results in essentially the same insulating layer film thickness and insulating properties on the hole side-walls and on the upper surfaces around the holes. Since the second electrode 7 is disposed on the surface at the top of each hole and since the active layer 3 and the second semiconductor layer 2 are exposed on the hole side-wall, it is essential to insulate the first conducting layer 21, which established on top of the first and second insulating layers 11, 12, and prevent shorting to the second electrode 7, the active layer 3 and the second semiconductor layer 2. Accordingly, to sufficiently insulate both the hole side-walls and the upper surfaces, it is preferable to establish approximately equal insulating characteristics on the side-walls and upper surfaces. Note that it is also desirable to form the second conducting layer 22 on the upper surface of the second semiconductor layer 2, and to form the first insulating layer 11 on top of the second conducting layer 22.

The first conducting layer 21 and the second conducting layer 22 can be light-transmitting conducting layers. In general, light-transmitting conducting layers including oxides of Zn, In, and Sn such as indium-tin-oxide (ITO), zinc oxide (ZnO), indium oxide ($In_2O_3$), and tin oxide ($SnO_2$) are favorable candidates. Of those materials, ITO is a conducting oxide material that includes tin in indium oxide. Since ITO has low electrical resistance and high light transparency, is used with favorable results as a light-transmitting electrode. Further, since a migration (e.g. electro-migration, ion migration) protection film is not necessary with ITO, element structures can be integrated with high density compared to a system using Ag electrodes. Or, a light-transmitting metal layer can be formed by sputtering a metal such as Ni to a film thickness of 3 nm, for example. To establish good Ohmic contact at the interface between a conducting oxide layer and semiconductor layer, the conducting oxide layer is heat-treated. Since ITO makes particularly good Ohmic contact to nitride semiconductor layers, contact resistance at the p-type semiconductor layer interface can be low, and a practical nitride semiconductor light emitting element with low forward-bias voltage (Vf) can be realized.

Example

Figure 9:
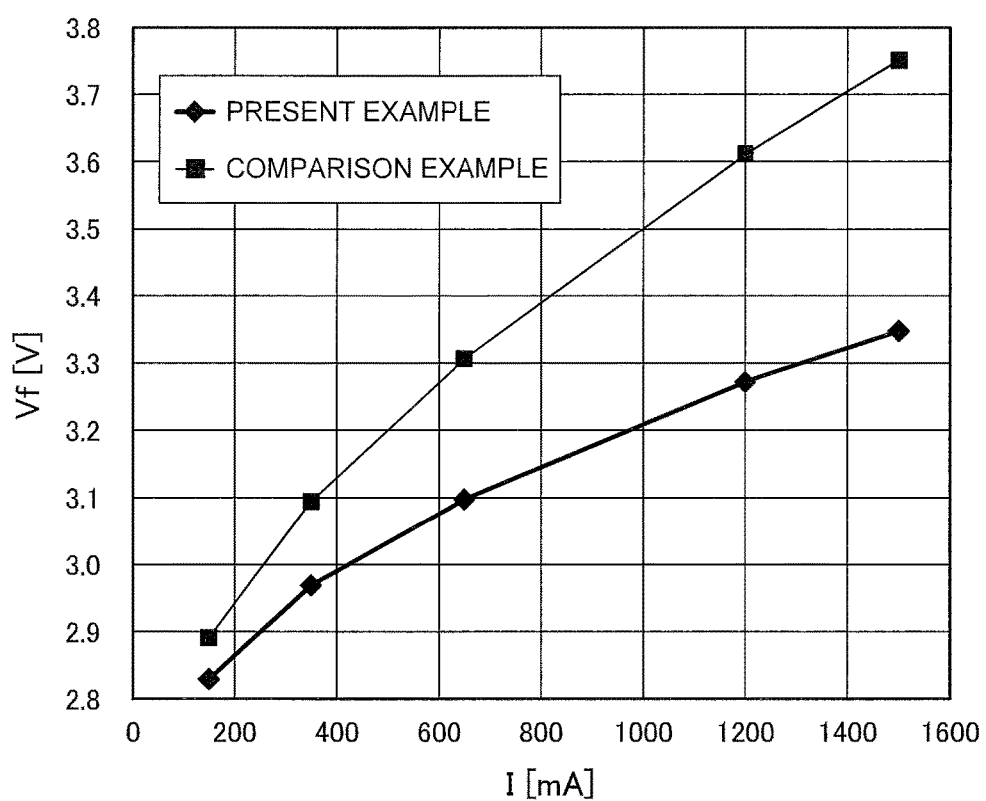
FIG. 9 is a graph showing the relation between the forward-bias voltage and driving current in an LED of an Example and in an LED of a comparison example.
Figure 10:
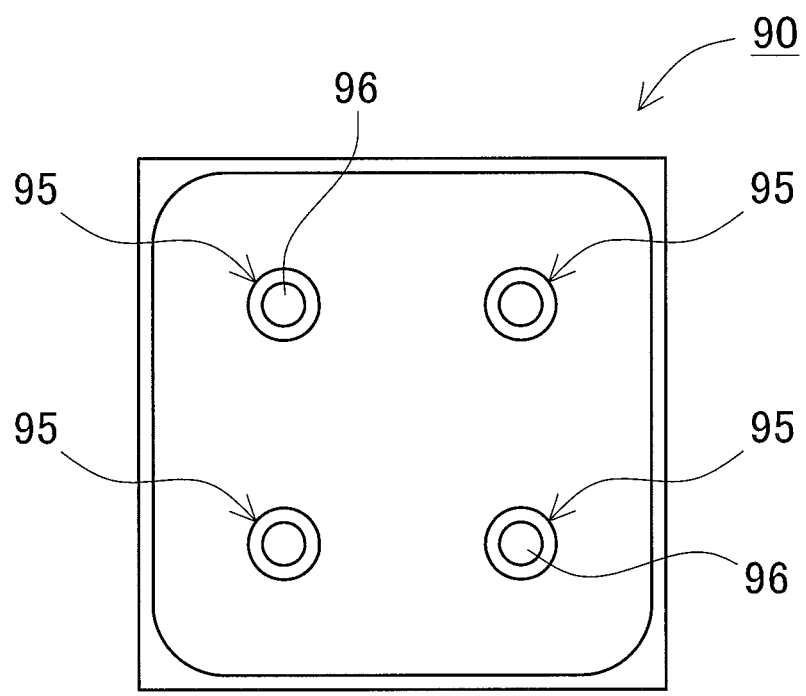
FIG. 10 is a plan view showing a related-art LED.

As previously noted, margin MGN between electrodes in the element structure is equivalent to the distance between semiconductor contact regions of the p-type conducting layer 97 and the n-type conducting layer 96. Therefore, by reducing that distance, a lower lateral component of resistance in the semiconductor layers and reduced forward-bias voltage (Vf) can be anticipated. Accordingly, an LED was produced as a semiconductor light emitting element according to an Example of the present invention, and the relation between forward-bias voltage Vf and driving current I for that an LED of the Example and an LED of a comparison example is shown in the graph of FIG. 9. Here, the Example LED is configured with 10 µm diameter φ holes to expose the first semiconductor layer, a hole pitch of 30 µm, and a total hole count of 1024. The comparison example LED is configured with 180 µm diameter φ holes and a total hole count of 4 (see FIG. 10). In both cases, the LED has a 1 mm square outline. As shown in FIG. 9, as current in the Example LED increases, the voltage difference with respect to the comparison example LED increases and it is clear that the Example LED operates with low resistance. Hence, lower Vf is obtained for the Example than the comparison example, suppression of heat generation and improved applied power efficiency are achieved, and superior characteristics of the invention described in this application are verified.

The semiconductor light emitting element according to embodiment of the present invention can be used in applications such as light sources for illumination and lighting, LED displays, backlight sources in liquid crystal displays etc., traffic signals, illuminated switches, various sensors and indicators, and other general consumer product light sources.

Obviously, numerous modifications and variations of the present invention are possible in light of the above teachings. It is therefore to be understood that within the scope of the appended claims, the invention may be practiced otherwise than as specifically described herein.

What is claimed is:

1. A semiconductor light emitting element comprising:
a first semiconductor layer having a first conducting type;
an active layer disposed over the first semiconductor layer;
a second semiconductor layer disposed over the active layer and having a second conducting type different than the first conducting type;
a first conducting layer electrically connected to the first semiconductor layer, the first conducting layer being a light-transmitting conducting layer;
a second conducting layer disposed on an upper surface of the second semiconductor layer, the second conducting layer being a light-transmitting conducting layer;
an insulating layer disposed at least on or above the upper surface of the second conducting layer; and
a first metal layer disposed on the first conducting layer,
wherein a plurality of holes are opened at given intervals through the second semiconductor layer to expose the first semiconductor layer at bottom surfaces of the holes,
wherein in each of the holes, the insulating layer covers from a side-wall surface of each of the holes to a first region provided on or above the upper surface of the second conducting layer around a top of each of the holes,
wherein the first conducting layer covers from the bottom surface of each of the holes to a second region provided over the second conducting layer and the insulating layer around the top of each of the holes, and
wherein the first metal layer forms a plurality of openings provided at given intervals over the first metal layer in a matrix pattern, each opening of the plurality of openings having a circular shape and being disposed between the holes as viewed in a plan view.

2. The semiconductor light emitting element according to claim 1, further comprising a light-reflecting layer disposed above the first conducting layer and the second conducting layer.

3. The semiconductor light emitting element according to claim 2, wherein the light-reflecting layer is an insulating layer configured as a multi-layer dielectric stack.

4. The semiconductor light emitting element according to claim 2, further comprising a second metal layer disposed on the second conducting layer,
wherein the light-reflecting layer is disposed between the first conducting layer and the second metal layer.

5. The semiconductor light emitting element according to claim 4, wherein the second metal layer has a plurality of openings corresponding to the holes as viewed in a plan view.

6. The semiconductor light emitting element according to claim 1, wherein a number of the holes is greater than or equal to 50.

7. The semiconductor light emitting element according to claim 1, wherein the interval between the holes is less than or equal to 40 µm.

8. The semiconductor light emitting element according to claim 1, wherein the inside diameter of the holes is less than or equal to 10 µm.

9. The semiconductor light emitting element according to claim 1, wherein the holes are disposed in a matrix pattern.

10. The semiconductor light emitting element according to claim 1, wherein the first conducting layer includes ITO.

11. The semiconductor light emitting element according to claim 1, wherein the second conducting layer includes ITO.

12. The semiconductor light emitting element according to claim 1, wherein the first semiconductor layer, the active layer, and the second semiconductor layer are $In_xAl_yGa_{1-x-y}N$, ($0 \leq x$, $0 \leq y$, $x+y<1$) layers.

13. The semiconductor light emitting element according to claim 4, wherein each of parts of the second metal layer are exposed from each of the openings of the first metal layer.

14. A semiconductor light emitting element having a main surface for light emission and an opposite surface to the main surface, the opposite surface being for mounting, the semiconductor light emitting element comprising:
   a first semiconductor layer having a first conducting type;
   an active layer disposed over the first semiconductor layer;
   a second semiconductor layer disposed over the active layer and having a second conducting type different than the first conducting type;
   a first conducting layer electrically connected to the first semiconductor layer, the first conducting layer being a light-transmitting conducting layer;
   a second conducting layer disposed on an upper surface of the second semiconductor layer, the second conducting layer being a light-transmitting conducting layer;
   an insulating layer disposed at least on or above the upper surface of the second conducting layer;
   a light-reflecting layer disposed above the first conducting layer and the second conducting layer;
   a first metal layer of n-side electrodes disposed on the first conducting layer, the first metal layer being formed substantially uniformly on the opposite surface; and
   a second metal layer of p-side electrodes disposed on the second conducting layer, the second metal layer being formed substantially uniformly on the opposite surface,
   wherein a plurality of holes are opened at given intervals through the second semiconductor layer to expose the first semiconductor layer at bottom surfaces of the holes,
   wherein in each of the holes, the insulating layer covers from a side-wall surface of each of the holes to a first region provided on or above the upper surface of the second conducting layer around a top of each of the holes,
   wherein the first conducting layer covers from the bottom surface of each of the holes to a second region provided over the second conducting layer and the insulating layer around the top of each of the holes, and
   wherein the light-reflecting layer is disposed between an upper surface of the first conducting layer and a lower surface of the second metal layer.

\* \* \* \* \*